United States Patent
Kang

(10) Patent No.: US 7,510,902 B2
(45) Date of Patent: Mar. 31, 2009

(54) IMAGE SENSOR CHIP PACKAGE AND METHOD OF FABRICATING THE SAME

(75) Inventor: Byoung Young Kang, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/101,769

(22) Filed: Apr. 11, 2008

(65) Prior Publication Data

US 2008/0188030 A1 Aug. 7, 2008

Related U.S. Application Data

(62) Division of application No. 11/241,044, filed on Sep. 30, 2005, now Pat. No. 7,372,122.

(30) Foreign Application Priority Data

Nov. 1, 2004 (KR) .................. 10-2004-0087920

(51) Int. Cl.
 *H01L 21/00* (2006.01)
(52) U.S. Cl. .............. 438/64; 438/48; 438/26; 438/22
(58) Field of Classification Search ........... 438/22, 438/26, 48, 64
 See application file for complete search history.

(56) References Cited

U.S. PATENT DOCUMENTS

| | | | |
|---|---|---|---|
| 6,002,163 A * | 12/1999 | Wojnarowski | ........... 257/620 |
| 6,429,036 B1 * | 8/2002 | Nixon et al. | ........... 438/57 |
| 6,455,927 B1 | 9/2002 | Glenn et al. | |
| 6,607,941 B2 * | 8/2003 | Prabhu et al. | ........... 438/113 |
| 6,781,244 B2 | 8/2004 | Prabhu | |
| 6,969,632 B2 | 11/2005 | Moden | |
| 7,067,354 B2 | 6/2006 | Prabhu | |
| 7,074,632 B2 | 7/2006 | Wada | |
| 7,192,796 B2 | 3/2007 | Zilber et al. | |
| 2005/0024752 A1 | 2/2005 | Webster | |

OTHER PUBLICATIONS

Stanley Wolf PhD. and Richard N. Tauber PhD.; Silicon Processing for The VLSI Era; Process Technology; vol. 1; pp. 854-857; 2000; Lattice Press; Sunset Beach, California.

* cited by examiner

*Primary Examiner*—Luan C Thai
(74) *Attorney, Agent, or Firm*—Andrew D. Fortney

(57) ABSTRACT

The present invention relates to an image sensor chip package and a method for fabricating the same. In one embodiment of an image sensor chip package, chip pads on a first surface of an image sensor chip are attached to electrode pads of a glass substrate with conductive material. In addition, electrode pads are connected to solder balls via a metal wiring pattern arranged on a second surface of the image sensor chip. As a result, the present invention can provide further miniaturized and thinned image sensor chip packages, reduce fabricating processes, and improve device performance and reliability.

13 Claims, 6 Drawing Sheets

IMAGE SENSOR CHIP PACKAGE AND METHOD OF FABRICATING THE SAME

This application is a divisional of U.S. application Ser. No. 11/241,044, filed on Sep. 30, 2005, now U.S. Pat. No. 7,372,122, which is hereby incorporated by reference herein in its entirety. This application also claims the benefit of Korean Application No. 10-2004-0087920, filed on Nov. 1, 2004, which is hereby incorporated by reference herein in its entirety.

BACKGROUND OF THE INVENTION

1. Field of the Invention

The present invention relates to an image sensor chip package and a method for fabricating the same. More specifically, the present invention relates to an image sensor chip package having no wire bonds and a fabrication method thereof, thus enabling production of further miniaturized and thinned packages.

2. Description of the Related Art

Conventionally, an image sensor is comprised of a semiconductor device that can transform an optical image into an electric signal. Such an image sensor is used for storage, transmission and display of an image signal. Semiconductor image sensors are generally classified into Charge-Coupled Device (CCD) and Complementary Metal Oxide Semiconductor (CMOS) image sensors. In a CCD image sensor, charges are transmitted in a desired direction by controlling the depth of potential wells. A CMOS image sensor includes one or more transistors and photodiodes as an optical sensor in one pixel.

A CCD image sensor has less susceptibility to noise and higher image qualities in comparison with CMOS image sensors. Accordingly, a CCD image sensor is applicable for high quality image devices such as a digital camera. On the other hand, a CMOS image sensor has low power consumption and low production cost in comparison with a CCD image sensor. In addition, a CMOS image sensor generally incorporates peripheral circuits. This is especially advantageous because CMOS image sensors may be produced by a general semiconductor device (e.g., CMOS) manufacturing technology. A CMOS image sensor is applicable for a camera attached to a personal digital assistant (PDA) or cellular phone. Because of the rapid progress of its manufacturing technology, CMOS image sensors have been used in a variety of applications.

Generally, an image sensor chip package is fabricated or packaged by attaching a transparent substrate to one surface of a chip (on which a sensing element is formed), and attaching a separate substrate to the other surface of the chip. The transparent substrate is generally used for receipt of light and protection of the chip. CLCC (Ceramic Leadless Chip Carrier), PLCC (Plastic Leadless Chip Carrier), COB (Chip on Board) and the like are used for packaging such an image sensor chip.

FIG. 1 shows an image sensor chip package fabricated by the CLCC packaging method. Referring to FIG. 1, a chip 102 is attached to a blank package 100 formed of ceramic material with an adhesive 104. The chip 102 is electrically connected to leads 108 disposed in the package 100 by gold (Au) or aluminum (Al) wires 106. Then, in order to protect the chip 102 and enable a sensing element 110 thereon to receive light, a transparent substrate 120 is attached on the top of the package 100.

Drawbacks of CLCC packages include limited numbers of leads and high cost. In the case of a CLCC chip package, a package is formed of ceramic material, which may limit the number of leads. In addition, due to the high price of ceramic packages, the CLCC chip package is not preferred for highly-integrated chips. In a PLCC chip package, a chip is attached to a blank package with an adhesive, and chip pads are electrically connected to leads inside the package with Au or Al wires. Then, for the protection of the chip and the receipt of a light, a transparent substrate is attached and sealed on the top of the package. A PLCC chip package may be fabricated by a conventional plastic package fabricating method. That is, a chip is attached to a lead frame pad with an adhesive, and then the chip and the lead frame are electrically connected to each other by wires. Further, epoxy molding compound (EMC) envelops the outside of the chip and the lead frame, except the upper surface of the chip. Then, a transparent substrate is attached and sealed on the upper surface of the chip. Finally, the package is completed through a trimming process, forming process and marking process on the lead frame.

However, such a PLCC chip package may develop a micro-gap between the epoxy molding compound and the transparent substrate due to a difference in material properties between the organic material and the inorganic material. In addition, the epoxy molding compound in a PLCC chip package does not block alpha particles, which can result in electrical failures of the image sensor element. As a result, the reliability of the PLCC package may be less than optimal.

Recently, COB packaging technology has been developed as a method for modularizing an image sensor chip package, using an anisotropic conductive film (ACF). ACF has also been also used in manufacturing liquid crystal display (LCD) panels. Korean Patent Laid-Open Publication No. 2003-69321 discloses a method for fabricating an image sensor chip package, which utilizes a Flip Chip Au bumping process and COB packaging technology.

According to the COB packaging technology, a chip is attached on a substrate provided with a predetermined pattern, and an electrode pad on the chip is electrically connected to the predetermined pattern with wires. Then, a transparent substrate is attached on the top of the chip, thus protecting the chip. However, such a COB chip package is modularized using a housing and a lens right after the chip is attached. Therefore, it may result in failures due to contamination of impurities.

SUMMARY OF THE INVENTION

It is, therefore, an object of the present invention to provide an image sensor chip package approaching the dimensions of chip size without wire bonding.

Another object of the present invention is to provide a method for fabricating an image sensor chip package which enables production of miniaturized and thinned image sensor chip packages by relatively simple processes.

To achieve the above objects, an embodiment of an image sensor chip package according to the present invention comprises: an image sensor chip having a first surface including image sensor elements and one or more chip pads, and a second surface opposing the first surface; a glass substrate comprising one or more electrode pads attached to the one or more chip pads via conductive material; a predetermined metal wiring pattern along the second surface of the chip, connected to the one or more electrode pads of the glass substrate; a solder resist on the second surface of the chip and the metal wiring pattern, the solder resist having one or more openings therein; and one or more solder balls connected to the metal wiring pattern through the openings in the solder resist.

In addition, a method for fabricating an image sensor chip package according to the present invention comprises the steps of: forming one or more chip pads on a first surface of a silicon wafer having image sensor elements thereon; preparing a glass substrate comprising one or more electrode pads; attaching the chip pads to the electrode pads of the substrate with conductive material; forming a cut along a scribe lane of the silicon wafer, the electrode pads of the glass substrate being exposed through the cut; forming a predetermined metal wiring pattern along the second surface of the silicon wafer, the metal wiring pattern coupling to the electrode pads of the glass substrate; forming a solder resist on the metal wiring pattern and the second surface; removing one or more portions of the solder resist; attaching a solder ball to the metal wiring pattern through a corresponding opening in the solder resist; and cutting the glass substrate along a scribe lane to separate each chip package.

These and other aspects of the invention will become evident by reference to the following description of the invention, often referring to the accompanying drawings.

DETAILED DESCRIPTION OF THE INVENTION

Figure 1:
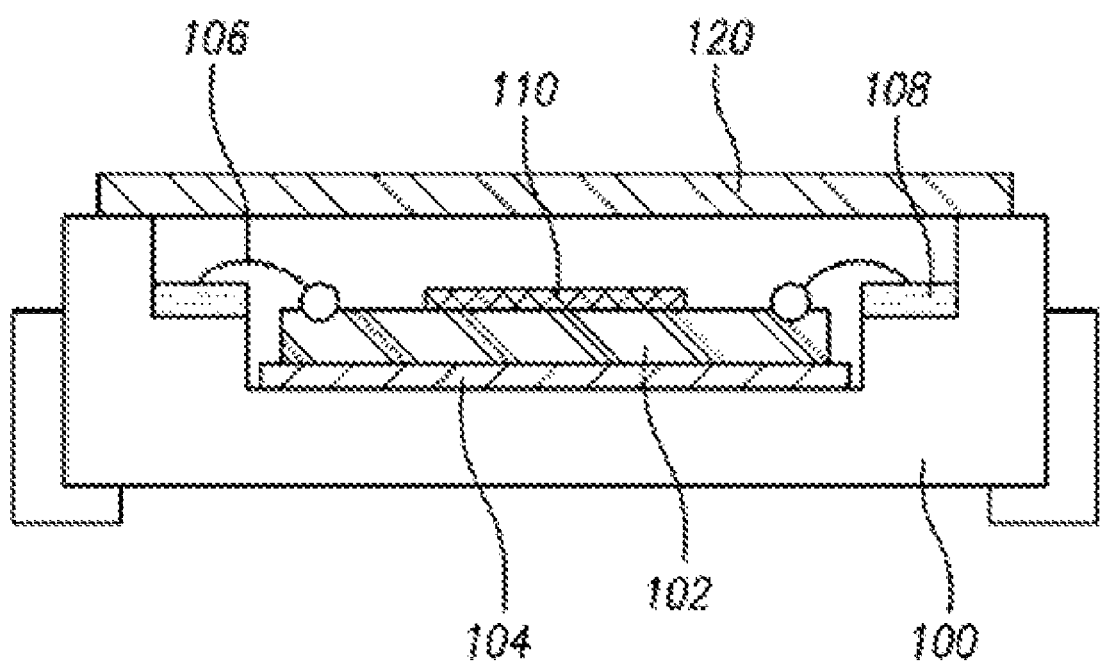
FIG. 1 is a cross-sectional view of a conventional CLCC chip package.
Figure 2:
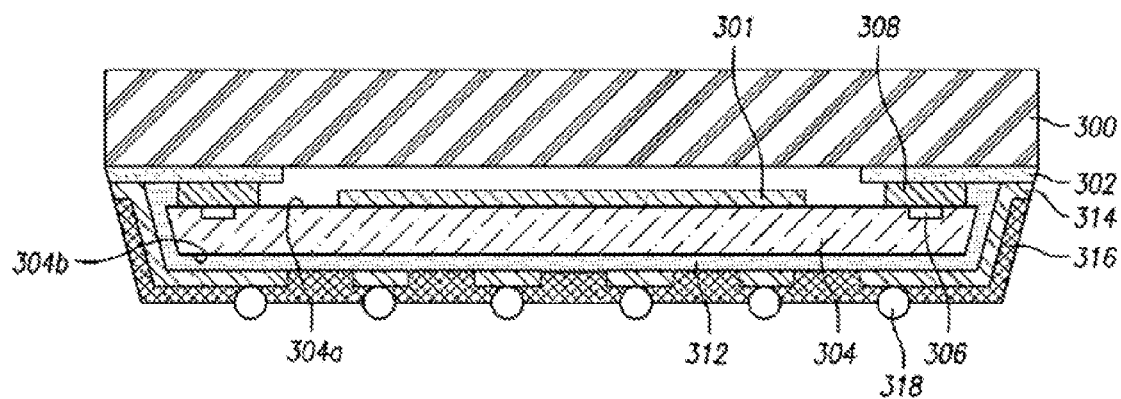
FIG. 2 is a cross-sectional view of an embodiment of an image sensor chip package according to the present invention

FIG. 2 is a cross-sectional view of an embodiment of an image sensor chip package according to the present invention. In the image sensor chip package as shown in FIG. 2, a first surface 304a of a chip 304 from a silicon wafer is provided with a light transmittance or sensing element 301 and chip pads 306. Chip 304 and/or chip pads 306 are electrically and physically attached to a glass substrate 300 with conductive material 308.

The glass substrate 300 is provided with electrode pads 302. The electrode pads 302 are connected to metal wiring pattern (or inter-surface connection) 314, which is placed along a second surface 304b of the chip 304. A protective film 312 is formed on the second surface 304b of the chip 304, and the metal wiring pattern 314 is generally formed on protective film 312. In addition, a solder-resist 316 covers an exposed portion of the metal wiring pattern 314 where it is not in contact with solder balls (or solder bumps) 318. An infrared filter may be attached to the glass substrate 300, although it is not shown in FIG. 2.

The image sensor chip package is electrically connected to other (external) components through, for example, a flexible printed circuit (FPC) or a printed circuit board (PCB) by solder balls 318, thus forming an image device such as a camera. In addition, the image sensor chip package according to the present invention may be used for a variety of image sensors and other chips including, but not limited to, an infrared image sensor, CCD image sensor and CMOS image sensor.

Hereinafter, an embodiment of a method for fabricating an image sensor chip package according to the present invention will be explained with reference to FIGS. 3A to 3H.

Figure 3A:
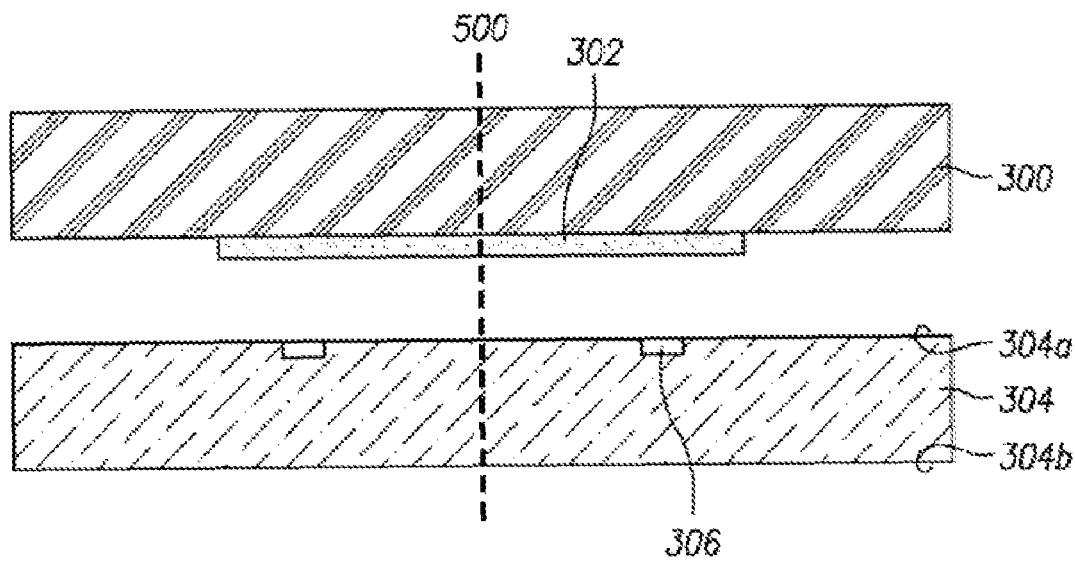
FIGS. 3A to 3H illustrate an embodiment of a method for fabricating an image sensor chip package according to the present invention.

First, as shown in FIG. 3A, a glass substrate 300 and a silicon wafer 304 are prepared. The glass substrate 300 is provided with electrode pad 302 having a predetermined pattern. Image sensor components, including a light transmitting or sensing element (not shown) and chip pads 306, are formed on a first surface 304a (e.g., an upper surface) of the silicon wafer 304. The silicon wafer 304 further has a second surface 304b (e.g., a lower surface) opposite to the first surface 304a. In addition, the silicon wafer 304 includes a plurality of image sensor chips to be individually separated by dicing along a scribe lane 500. Glass substrate 300 may comprise any suitable material having desired, suitable or predetermined optical properties (e.g., silica glass, quartz, sapphire). Glass substrate 300 may be laminated with an impact-resistant plastic or substituted with an impact-resistant, transparent plastic (e.g., polycarbonate).

Figure 3B:
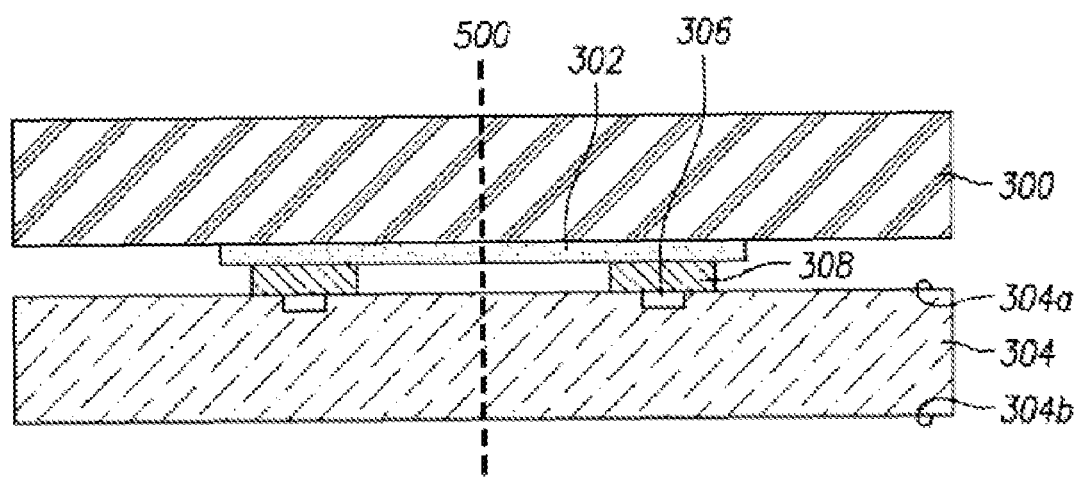

Next, as shown in FIG. 3B, the electrode pad 302 and chip pads 306 are electrically coupled by conductive material 308, thereby mechanically, physically and/or chemically attaching the silicon wafer 304 to the glass substrate 300. The glass substrate 300 may further include an infrared filter (not shown). FIG. 3B illustrates that, in general, packaging begins prior to separation of wafer die.

In such an attaching process, an anisotropic conductive film or anisotropic conductive paste may be used as conductive material 308. In case of an anisotropic conductive film, it is compressed and heated between the glass substrate 300 and the silicon wafer 304.

Figure 3C:
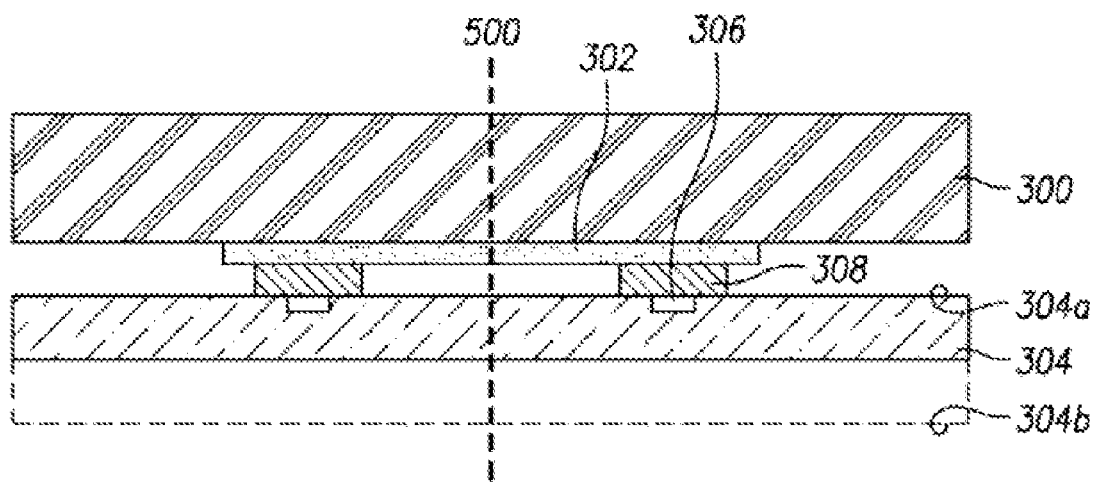

As shown in FIG. 3C, in some embodiments the second surface 304b of the silicon wafer 304 is polished or ground so that the silicon wafer 304 has a desired thickness. The thickness of the silicon wafer 304 determines a thickness of an image sensor chip. The silicon wafer 304 may be polished by a chemical mechanical polishing (CMP) process or ground by conventional backgrinding.

Figure 3D:
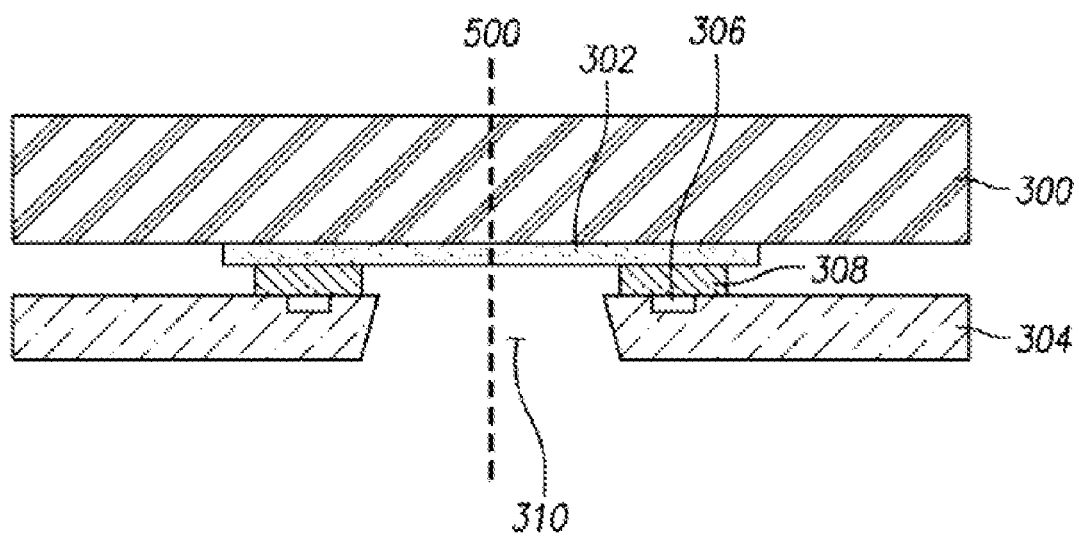

Subsequently, as shown in FIG. 3D, the vicinity of the scribe lane 500 in the silicon wafer 304 is etched until electrode pads 302 of the glass substrate 300 are revealed. As a result, a cut 310 is formed. The cut 310 may be formed by, for example, a wet etch, dry etch, or reactive ion etch (RIE). FIG. 3D illustrates that, in general, die separation does not occur until a point during die packaging. FIG. 3D further illustrates that despite die separation, die remain together as a unit with glass substrate 300 until glass substrate 300 is segmented to form individual packaged die.

Figure 3E:
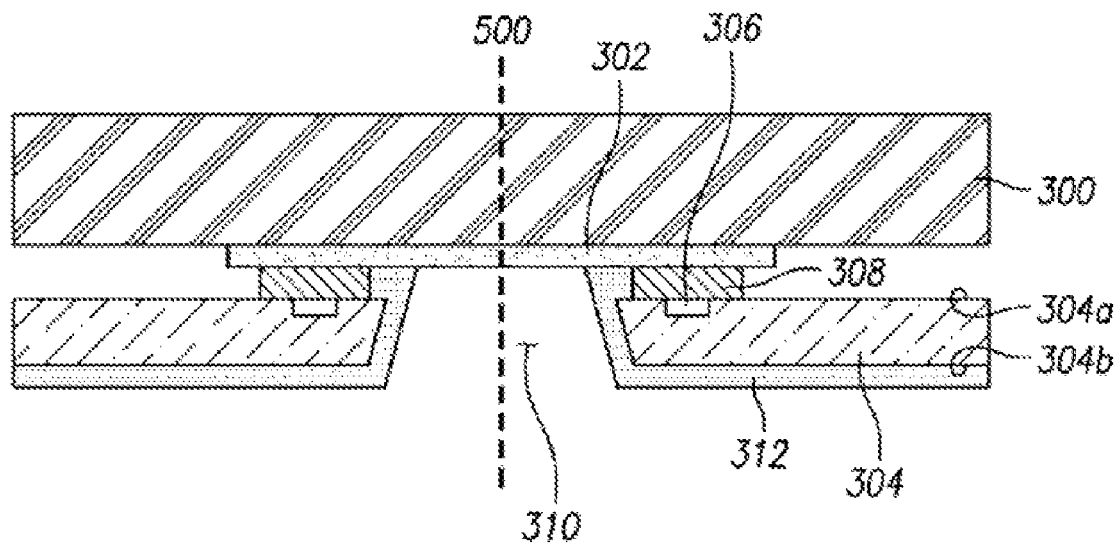

As shown in FIG. 3E, a protective film 312 is formed to cover the second surface 304b of the etched silicon wafer 304 (i.e., the die) and the cut 310. However, to form electrical connections to external circuits or devices, a portion of the electrode pad 302 should be exposed. In order to expose the portion of the electrode pad 302, a known photolithography process may be used. Preferably, the protective film 312 comprises BCB (benzocyclobutene), having superior properties of passivation and adhesion, or a polyimide having a low dielectric constant, for example.

Figure 3F:
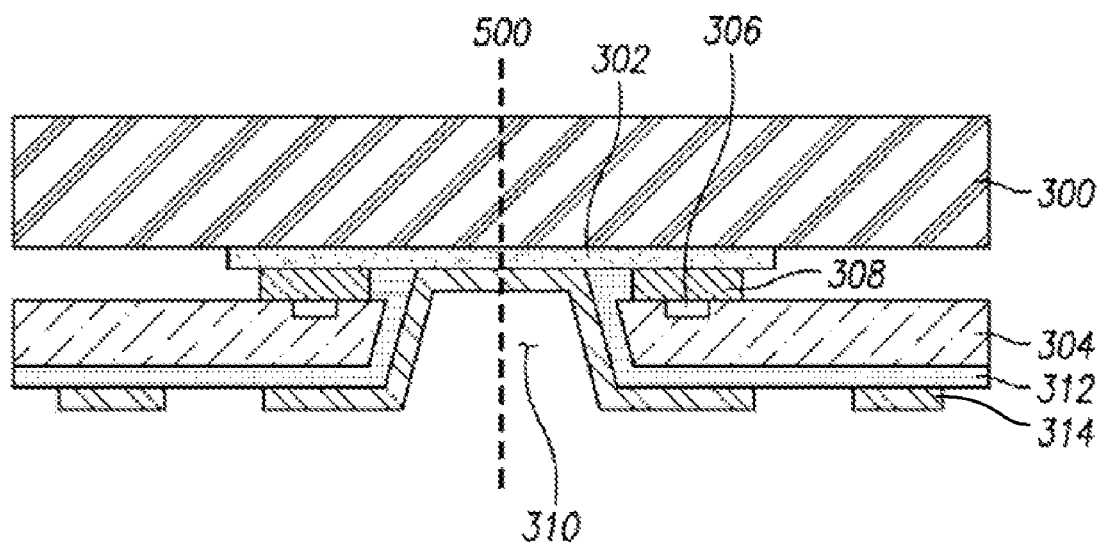

Next, as shown in FIG. 3F, a metal film (not shown) is formed on the protective film 312. Then, the metal film is patterned to form metal wiring pattern 314. The metal wiring pattern 314 makes an electrical connection between one of the chip pads 306 (through conductive material 308 and electrode pad 302) and a solder ball or other external package contact to be formed later, thereby enabling chip pads 306 to be electrically connected with external circuits.

Figure 3G:
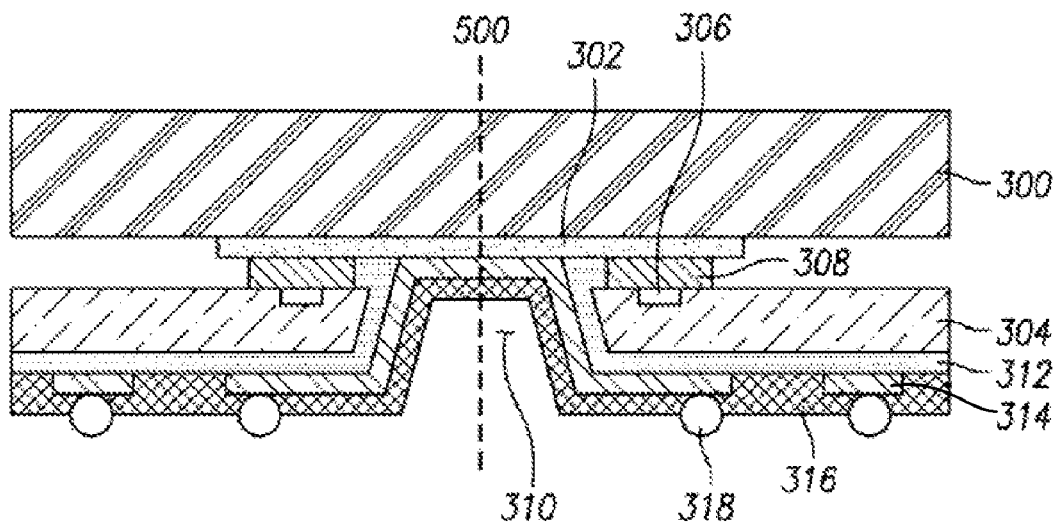

Subsequently, as shown in FIG. 3G, a solder resist 316 is applied and cured on the metal wiring pattern 314 and an exposed portion of the protective film 312 (i.e., the area of protective film 312 on which the metal wiring pattern 314 is not formed). Then, predetermined areas of the solder resist 316 are removed and solder balls 318 are attached to metal wiring pattern 314 exposed by removal of portions of the solder resist 316. The solder balls 318 may comprise copper (Cu), gold (Au), tin (Sn), or an alloy thereof (such as a conventional lead-free alloy) however, many electrically conductive materials may be suitable for solder balls 318. In addition, the solder balls 318 may be formed by, for example, ball bonding, plating or printing methods.

Figure 3H:
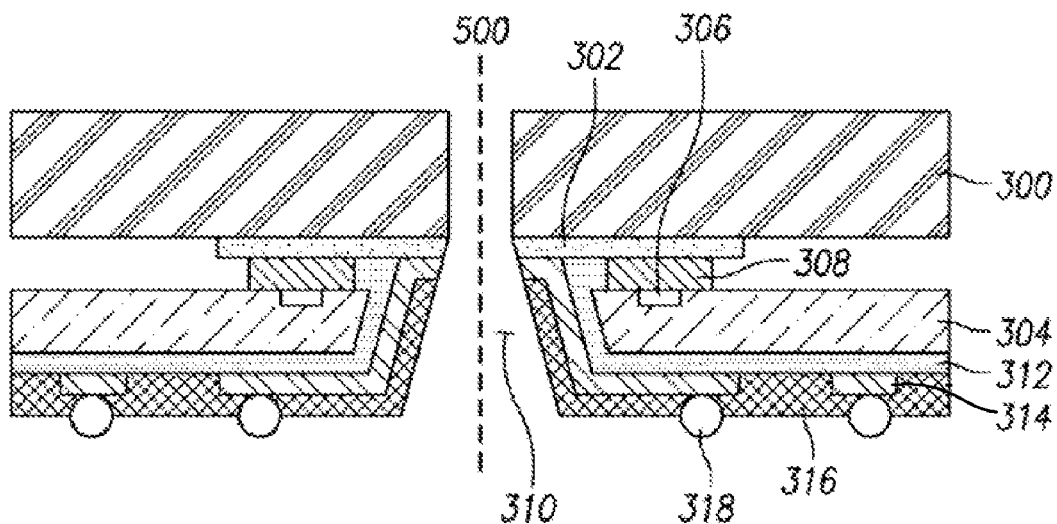

Next, as shown in FIG. 3H, the glass substrate 300 is cut along the scribe lane 500, thus separating individual chips and, as a result, forming the image sensor chip package as shown in FIG. 2.

As shown in FIGS. 2 and 3H, in the image sensor chip package according to an embodiment of the present invention, chip pads 306 of the silicon wafer die 304 are connected to electrode pads 302 of the glass substrate 300 via conductive material 308, and electrode pads 302 are connected to solder balls 318 via the metal wiring pattern 314 arranged on the second surface 304b of the silicon wafer die 304. Solder balls 318 may be connected to a flexible printed circuit (FPC), a printed circuit board (PCB) or other medium for interconnecting components on a board and/or in a device (such as a camera) by, for example, compressing and heating an anisotropic conductive film. In other embodiments, solder balls 318 may be directly attached to external electrode pads of a FPC or PCB by an ultrasonic method. Optionally, a lens and lens housing may be assembled with the packaged image sensor chip into an imaging device such as camera.

The present invention provides, for example, an image sensor chip package wherein a cut is formed along a scribe lane of a silicon wafer, and electrical connections between chip pads and solder balls are formed via electrode pads on the glass substrate and the metal wiring pattern along the cut and the second surface of the chip. As a result, the present invention may enable (i) production of further miniaturized and thinned image sensor chip packages approaching the dimensions of chip size and (ii) improvement of device performance and reliability.

In addition, the present invention is applicable to packaged die other than image sensor die, for example, production of Multi Chip Modules (MCMs), mobile systems, Micro-Electro-Mechanical Systems, and so on.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating an image sensor chip package, comprising the steps of:

forming one or more chip pads on a first surface of a silicon wafer having image sensor elements thereon;

attaching the chip pads to electrode pads on a glass substrate with conductive material;

cutting or etching along a scribe lane of the silicon wafer, the electrode pads of the glass substrate being exposed through the cut;

forming a metal wiring pattern on the second surface of the silicon wafer, the metal wiring pattern coupling to the electrode pads of the glass substrate;

forming a solder resist on the metal wiring pattern and the second surface;

removing a portion of the solder resist;

attaching a solder ball to the metal wiring pattern through the removed portion of solder resist; and cutting the glass substrate along a scribe lane to separate the chip package.

2. The method of claim 1, further comprising the step of: attaching an infrared filter to the glass substrate.

3. The method of claim 1, further comprising the step of: polishing or grinding the second surface of the silicon wafer.

4. The method of claim 1, further comprising the step of: forming a protective film on the second surface and the exposed electrode pads before forming the metal wiring pattern.

5. The method of claim 4, wherein the protective film comprises benzocyclo-butene (BCB) or polyimide.

6. The method of claim 1, further comprising the step of: attaching the solder ball to a flexible printed circuit or printed circuit board after separating each chip package.

7. The method of claim 1, wherein the metal wiring pattern is physically connected to the electrode pads of the glass substrate.

8. The method of claim 1, wherein the solder ball comprises copper (Cu), gold (Au), tin (Sn), or an alloy thereof.

9. The method of claim 1, wherein the conductive material comprises an anisotropic conductive film or an anisotropic conductive paste.

10. The method of claim 1, wherein the protective film completely covers the second surface of the chip.

11. The method of claim 1, wherein cutting the glass substrate comprises reactive ion etching (RIE).

12. The method of claim 1, wherein the glass substrate comprises silica glass, quartz, or sapphire.

13. The method of claim 1, wherein the glass substrate further comprises an impact-resistant plastic lamination thereon.

* * * * *